United States Patent [19]

Kodali et al.

[11] Patent Number: 5,724,249

[45] Date of Patent: Mar. 3, 1998

[54] SYSTEM AND METHOD FOR POWER MANAGEMENT IN SELF-RESETTING CMOS CIRCUITRY

[75] Inventors: Visweswara Rao Kodali; Salim Ahmed Shah, both of Austin, Tex.

[73] Assignee: International Business Machines Corp., Armonk, N.Y.

[21] Appl. No.: 461,961

[22] Filed: Jun. 5, 1995

[51] Int. Cl.$^6$ .................. H03K 19/02; H03K 19/094
[52] U.S. Cl. .................. 364/488; 326/83; 326/86
[58] Field of Search .................. 364/488, 489; 326/17, 58, 83, 86

[56] References Cited

U.S. PATENT DOCUMENTS

| | | | |
|---|---|---|---|
| 4,972,102 | 11/1990 | Reis et al. | 326/115 |
| 5,300,831 | 4/1994 | Pham et al. | 327/544 |
| 5,326,965 | 7/1994 | Inoue | 235/492 |
| 5,329,178 | 7/1994 | Burton | 327/544 |
| 5,337,285 | 8/1994 | Ware et al. | 365/227 |
| 5,362,989 | 11/1994 | Hennedy | 327/544 |
| 5,371,709 | 12/1994 | Fisher et al. | 365/226 |
| 5,434,519 | 7/1995 | Trinh et al. | 326/83 |

*Primary Examiner*—Vincent N. Trans
*Attorney, Agent, or Firm*—Kelly K. Kordzik; Winstead Sechrest & Minick P.C.; Mark E. McBurney

[57] ABSTRACT

A "no select state" is implemented with self-resetting CMOS logic circuitry so as to essentially disable the resetting function of this logic circuitry when the logic circuitry is in an idle state. As an example, within a multiplier circuit in a processor, the selection inputs to a multiplexor circuit are de-selected when there is no need for the multiplier circuitry.

18 Claims, 9 Drawing Sheets

SYSTEM AND METHOD FOR POWER MANAGEMENT IN SELF-RESETTING CMOS CIRCUITRY

TECHNICAL FIELD OF THE INVENTION

The present invention relates in general to data processing systems, and in particular, to self-resetting logic circuitry within a data processing system.

BACKGROUND OF THE INVENTION

A logic circuit is a circuit designed to perform a particular logical function based on the concepts of "and", "either-or", "neither-nor", etc. Normally, these circuits operate between two discreet voltage levels, i.e. high and low logic levels, and are described as binary logic circuits.

Binary logic circuits are the basic building blocks of data processing systems and almost any electronic computing device. Binary logic circuits are extensively used in computers to carry out instructions and arithmetical processes. Any logical procedure may be effected by using a suitable combination of these basic gates.

Because of their low power dissipation, complimentary CMOS (metal-insulator-semiconductor) field-effect transistors (FETs) are often used to construct such logic circuits.

Figure 1:
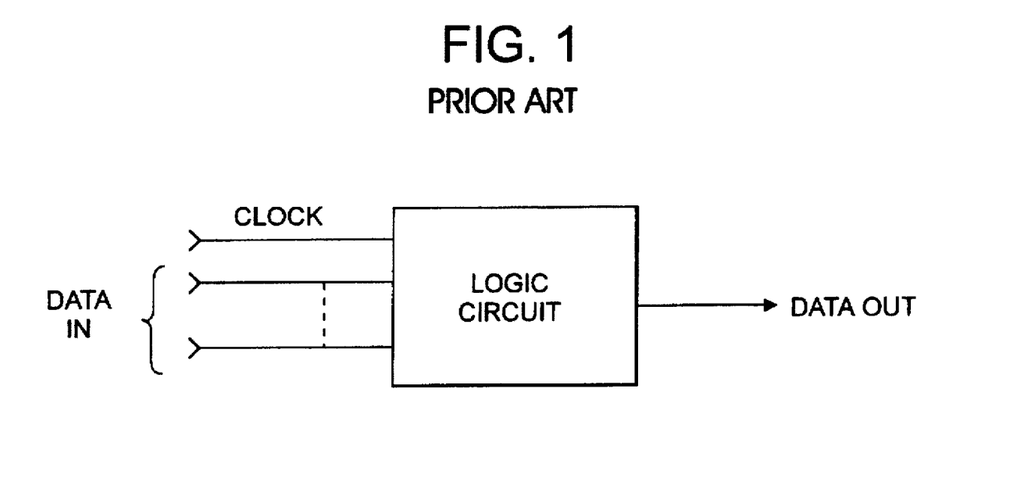
FIG. 1 illustrates a prior art logic circuit implemented with a synchronous clock signal.

Because logic circuits are often cascaded in a plurality of connected stages, clock pulses are applied to the elements of a logic circuit to effect logical operations, i.e., drive the logical circuit. Referring to FIG. 1, there is illustrated a typical logic circuit, which may implement any logical function, having one or more Data In inputs and a Data Out output. A clock signal is inputted to the logic circuit in order to drive the Data In inputs through the logic circuit in order to effect the associated logical function implemented in the logic circuit upon the data inputs in order to arrive at the solution, which is outputted as Data Out.

The periodic clock signal also serves to prepare, or precharge, the logic circuit so that it is ready for the next series of Data In inputs subsequent to outputting the previous Data Out.

One problem with utilizing a clock signal to synchronize all logical operations within very large scale integrated (VLSI) circuitry is that the overall system clock signal may be subjected to noise and clock skew while being transmitted throughout the VLSI circuitry, resulting in a distorted and inaccurate clock signal incorrectly driving any particular logic circuit, which may ultimately result in inaccurate operation of the VLSI circuitry.

Another problem is that traditional clocking for precharged circuits also requires the intersection of a "precharge phase" or "time" into the system. This time may decrease the overall system performance by requiring foot devices (also known as evaluate or interrupt devices) causing an increase in power and delay.

Figure 2:
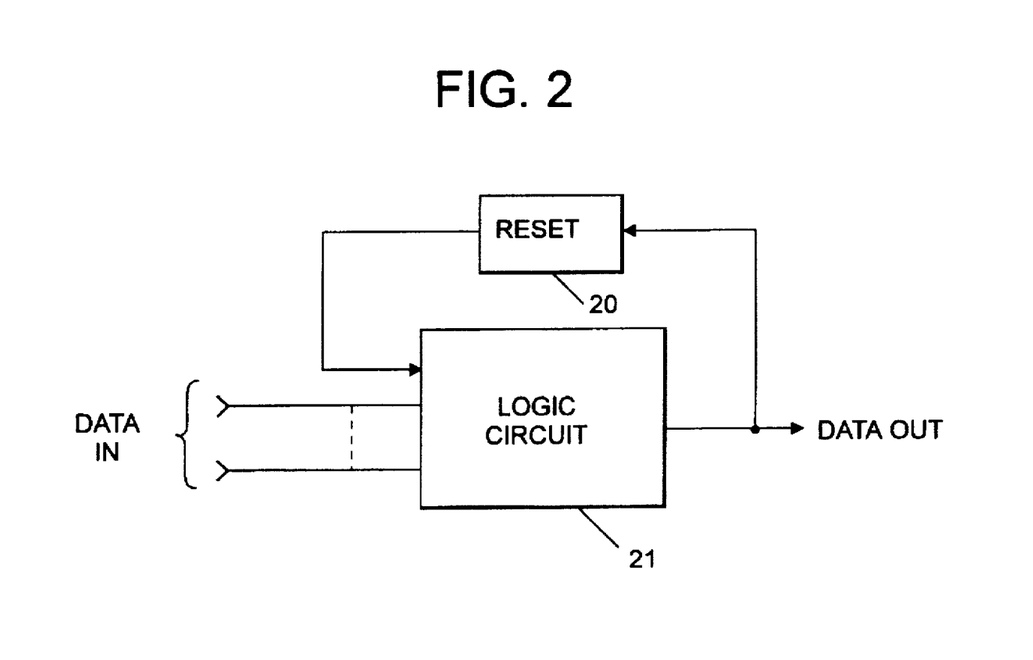
FIG. 2 illustrates a logic circuit implemented with a reset signal.

Referring to FIG. 2, a solution to the foregoing problem is the use of reset circuit 20 in order to precharge logic circuit 21 to a ready state so that it can accept the Data In and perform the logical operation correctly. In such a design, a clock signal is not needed.

Figure 3:
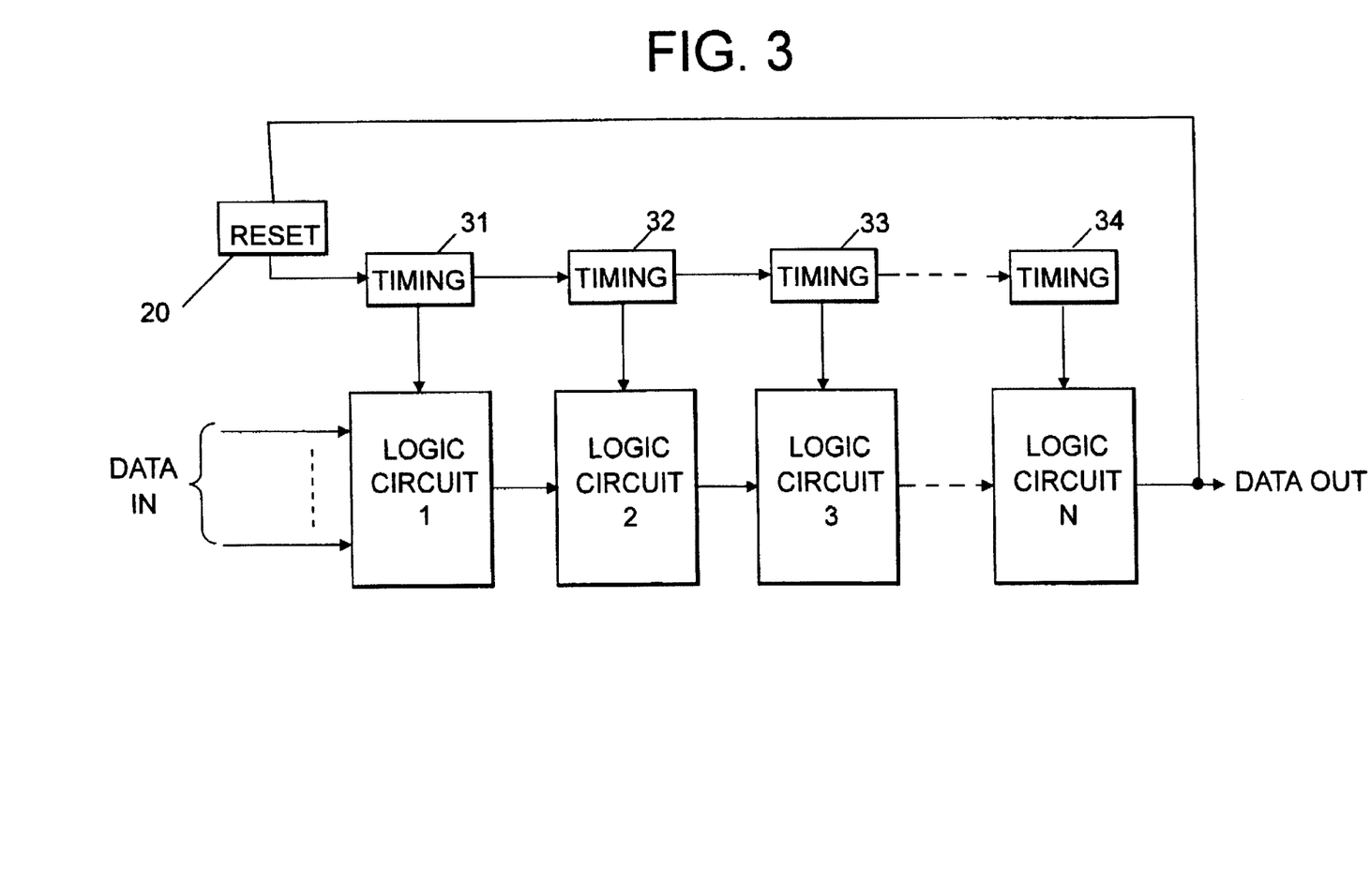
FIG. 3 illustrates a cascading of logic circuits implemented with a reset signal.

Referring next to FIG. 3, there is illustrated a cascade of logic circuits 1, 2, 3, . . . N. The output Data Out is sent to reset circuit 20, which operates to reset each of logic circuits 1-N. Timing circuits 31, 32, 33 and 34 operate to properly time the resetting of the logic circuits 1-N so that the reset occurs at the proper time, e.g., after each logic circuit has performed its operation and outputted its result. Timing circuits 31-34 may comprise conventional buffer circuits.

Figure 4:
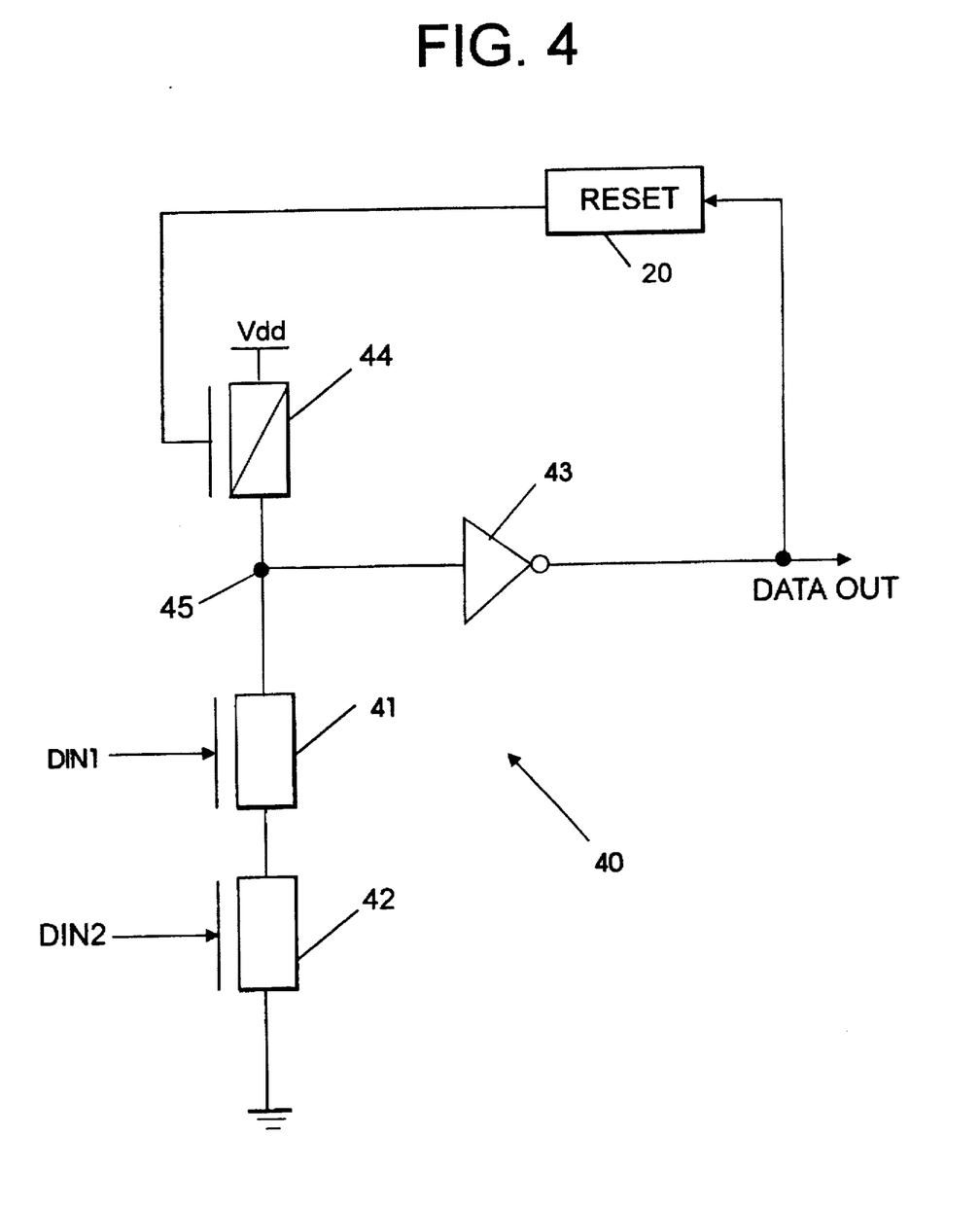
FIG. 4 illustrates a more detailed diagram of a logic circuit implemented with a reset signal.

A more detailed diagram of a self-resetting logical circuit is illustrated in FIG. 4, wherein there is illustrated typical logic circuit 40, which is operable to perform a logical AND operation on the input data Din1 and Din2. The circuit, being made in the CMOS technology, has its P-channel FETs indicated by a rectangle with a diagonal line formed therein and a gate electrode arranged adjacent thereto and its N-channel FETs indicated by a rectangle without a diagonal line and a gate electrode arranged adjacent thereto. This convention will be followed through the various FIGURES.

N-FETs 41 and 42 receive the inputted data. If either Din1 or Din2 is at a logical low level, then node 45 is at a logical high level resulting in a logical low level outputted as Data Out because of the transmission of the high level at node 45 through inverter circuit 43. If both of the inputs Din 1 and Din2 are at a logical high level, then N-FETs 41 and 42 will be turned on resulting in a logical low level at node 45 resulting in a logical high level being outputted at Data Out.

Logical circuit 40 also includes P-FET device 44 coupled between node 45 and voltage supply VDD. Reset circuit 20 is coupled between the output terminal and the gate electrode of device 44. Reset circuit 20 may act to apply a low level signal to the gate electrode of 44 upon receiving the high level output from the output of inverter circuit 43. Thus, upon output of a high level signal from circuit 40, reset circuit 20 will result in a precharging of node 45 to a high level through the switching on of P-FET device 44. Circuit 40 is then ready to receive another set of input values for a subsequent logical operation.

One problem with self-resetting dynamic circuit technology is that it implements an aggressive cycle time that leads to a corresponding high power dissipation, which is a difficult packaging and cooling challenge, as well as a high demand on the power supply when compared to previous generation CMOS logic circuitry.

Figure 11:
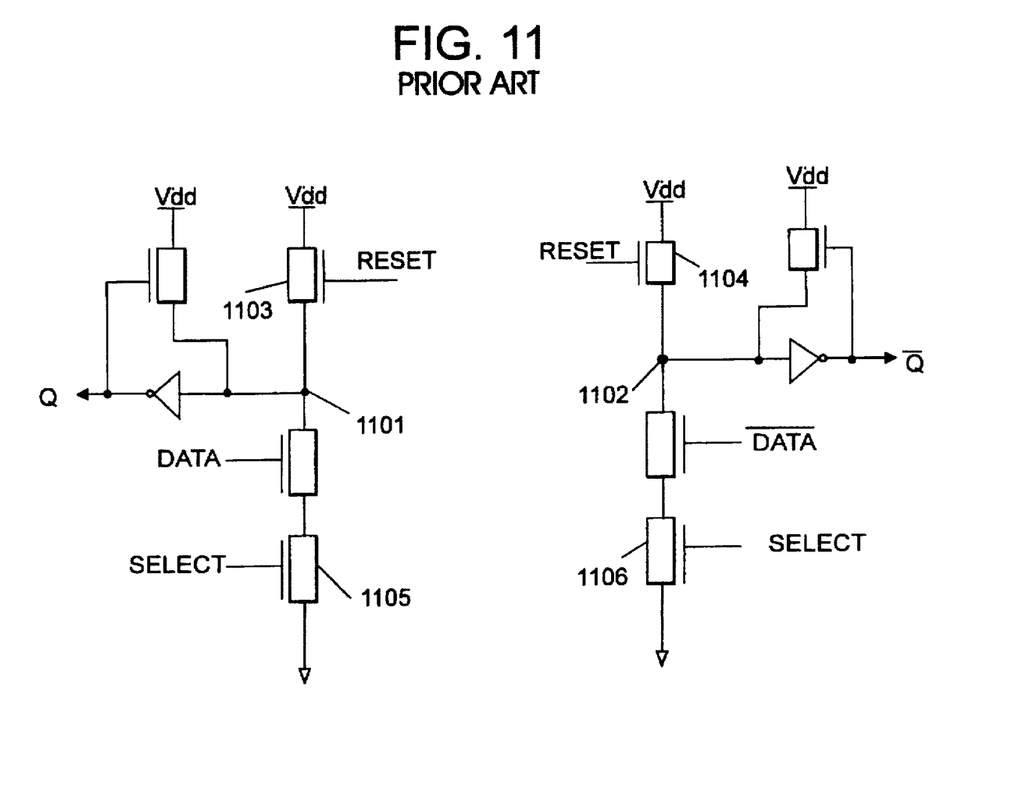
FIG. 11 illustrates a prior art self-resetting logic circuit.

For example, within the multiply unit in the fixed point hardware in a microprocessor, the multiply unit spends a considerable amount of its time in a logical idle state. However, when the multiply unit is implemented with CMOS dynamic self-resetting circuitry, it is dissipating AC power as if it was fully utilized. This is understood by looking at a "typical self-resetting circuit" schematic in FIG. 11. With this type of circuit, the nodes 1101 and 1102 are unconditionally charged through reset P-devices 1103 and 1104, respectively, on every machine cycle. Also on every cycle, the evaluate N-type devices 1105 and 1106 driven by the SELECT input are turned on every cycle at which nodes 1101 and 1102 are discharged approximately 95% of the time.

Thus, there is a need in the art for a technique to lower power dissipation within self-resetting CMOS logical circuitry whenever such a logic circuit is idle.

SUMMARY OF THE INVENTION

The present invention solves the foregoing need by mining off a functional logical element within a processor or other logical VLSI integrated circuit when the element is idle so it will not dissipate power. Essentially, the present invention provides a "no select state" to a self-resetting logical circuit when that circuit is not needed. This "no select state" inhibits the self-resetting dynamic logic circuit from being evaluated so that the output node cannot be discharged to ground and no AC power is dissipated.

The present invention is accomplished by "turning off" all of the SELECT inputs to a multiplexor circuit, which functions as a switching mechanism for sending data to be operated on by date flow circuits coupled to the multiplexor circuit. When the SELECT inputs are set to low values, the N-type CMOS devices they are coupled to are not turned on resulting in no dissipation of AC power to ground within the selected portions of the multiplexor circuit.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF A PREFERRED EMBODIMENT OF THE INVENTION

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 5:
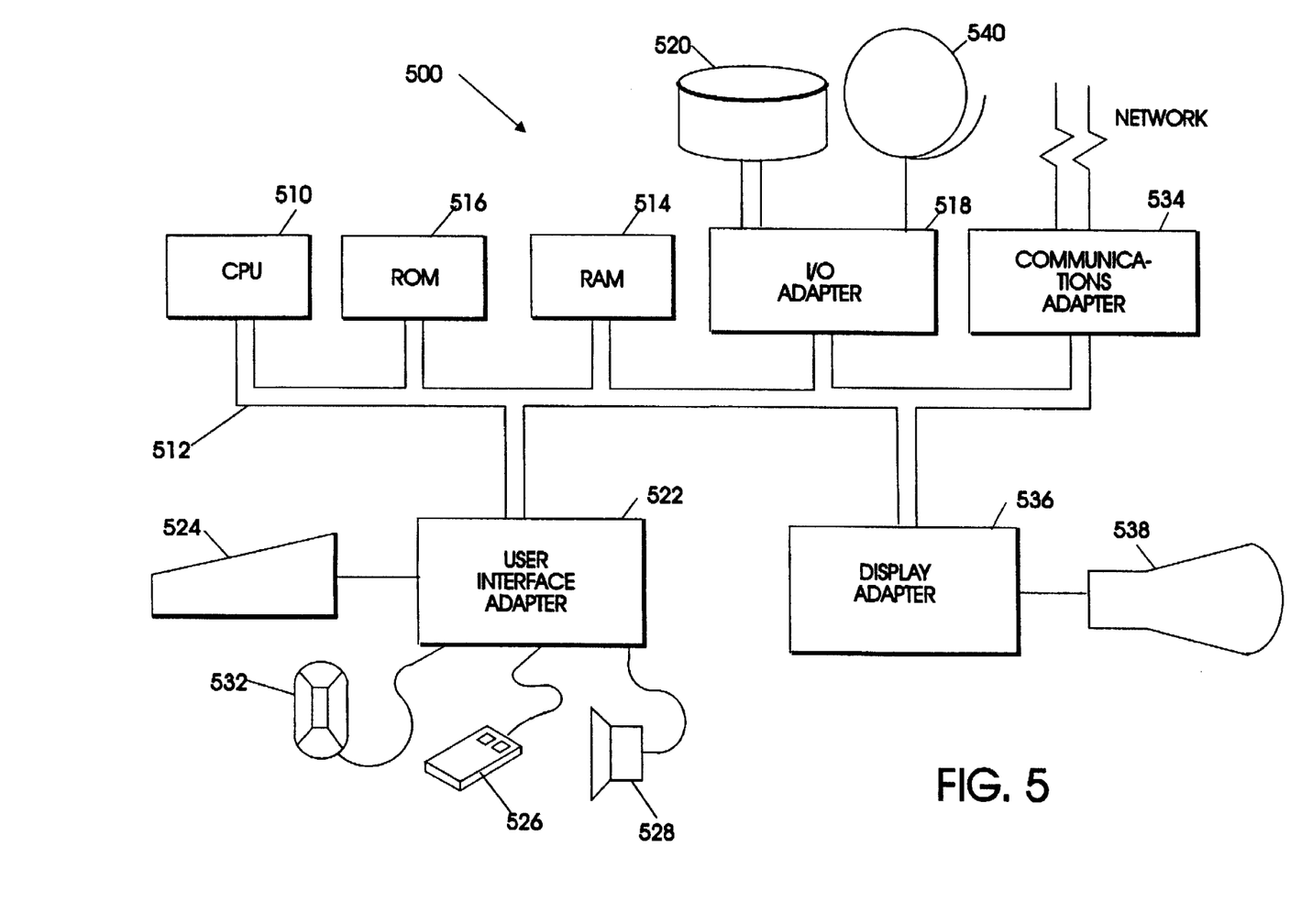
FIG. 5 illustrates a data processing system configurable in accordance with the present invention.

A representative hardware environment for practicing the present invention is depicted in FIG. 5, which illustrates a typical hardware configuration of workstation 500 in accordance with the subject invention having central processing unit ("CPU") 510, such as a conventional microprocessor, and a number of other units interconnected via system bus 512. Workstation 500 shown in FIG. 5 includes random access memory (RAM) 514, read only memory (ROM) 516, and input/output (I/O) adapter 518 for connecting peripheral devices such as disk units 520 and tape drives 540 to bus 512, user interface adapter 522 for connecting keyboard 524, mouse 526, speaker 528, microphone 532, and/or other user interface devices such as a touch screen device (not shown) to bus 512, communication adapter 534 for connecting workstation 500 to a data processing network, and display adapter 536 for connecting bus 512 to display device 538.

Figure 6:
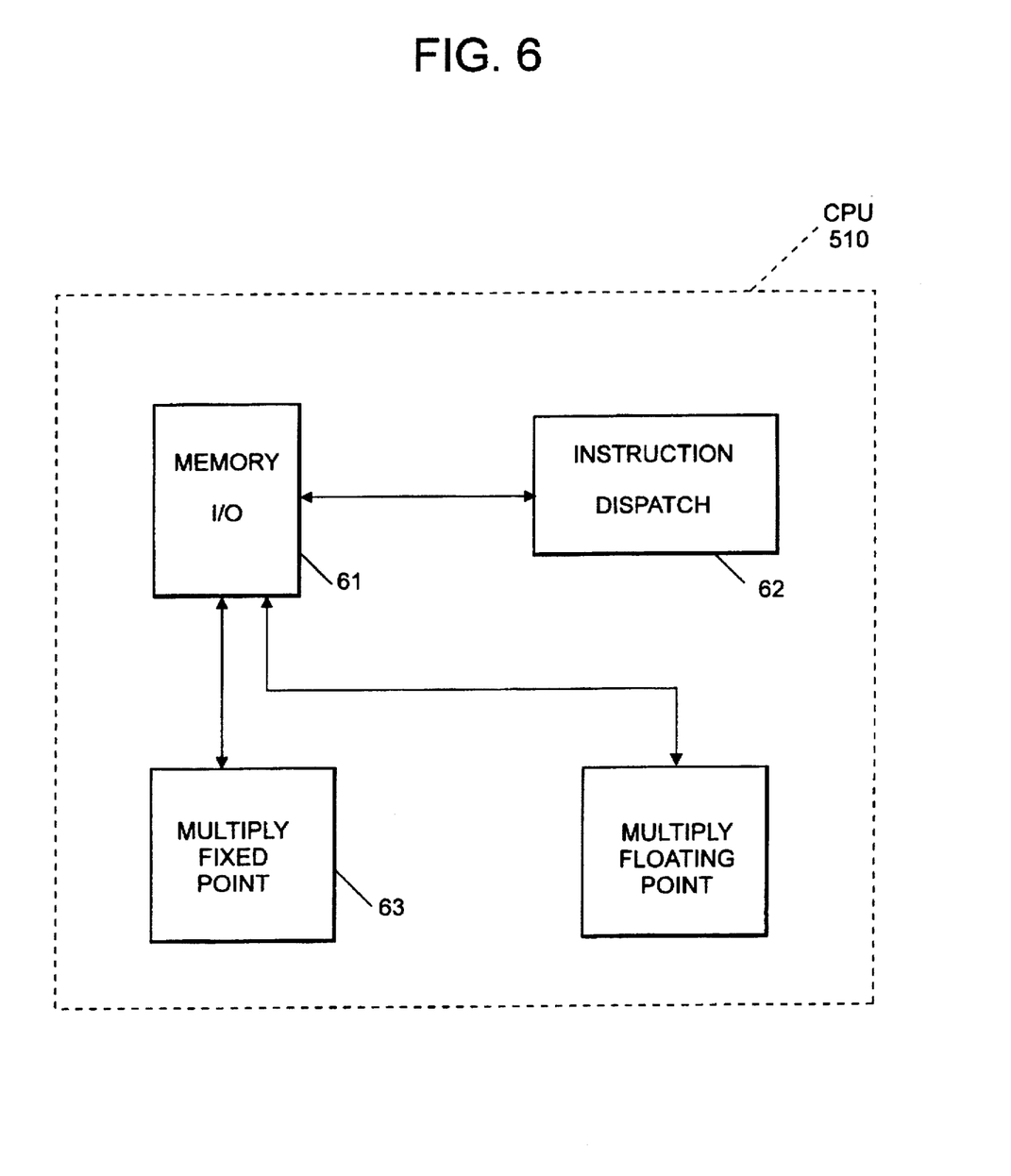
FIG. 6 illustrates a CPU configurable in accordance with the present invention.

Referring next to FIG. 6, there is illustrated CPU 510 comprising memory I/O 61, instruction dispatch circuit 62, a floating point multiplier and fixed point multiplier 63. The present invention may be utilized within any one of the foregoing elements within CPU 510 or within any other circuit in data processing system 500 where self-resetting CMOS logic circuitry is used. However, for illustration purposes, the following discussion of the present invention will be with respect to self-resetting logic circuitry in fixed point multiplier 63.

Figure 7:
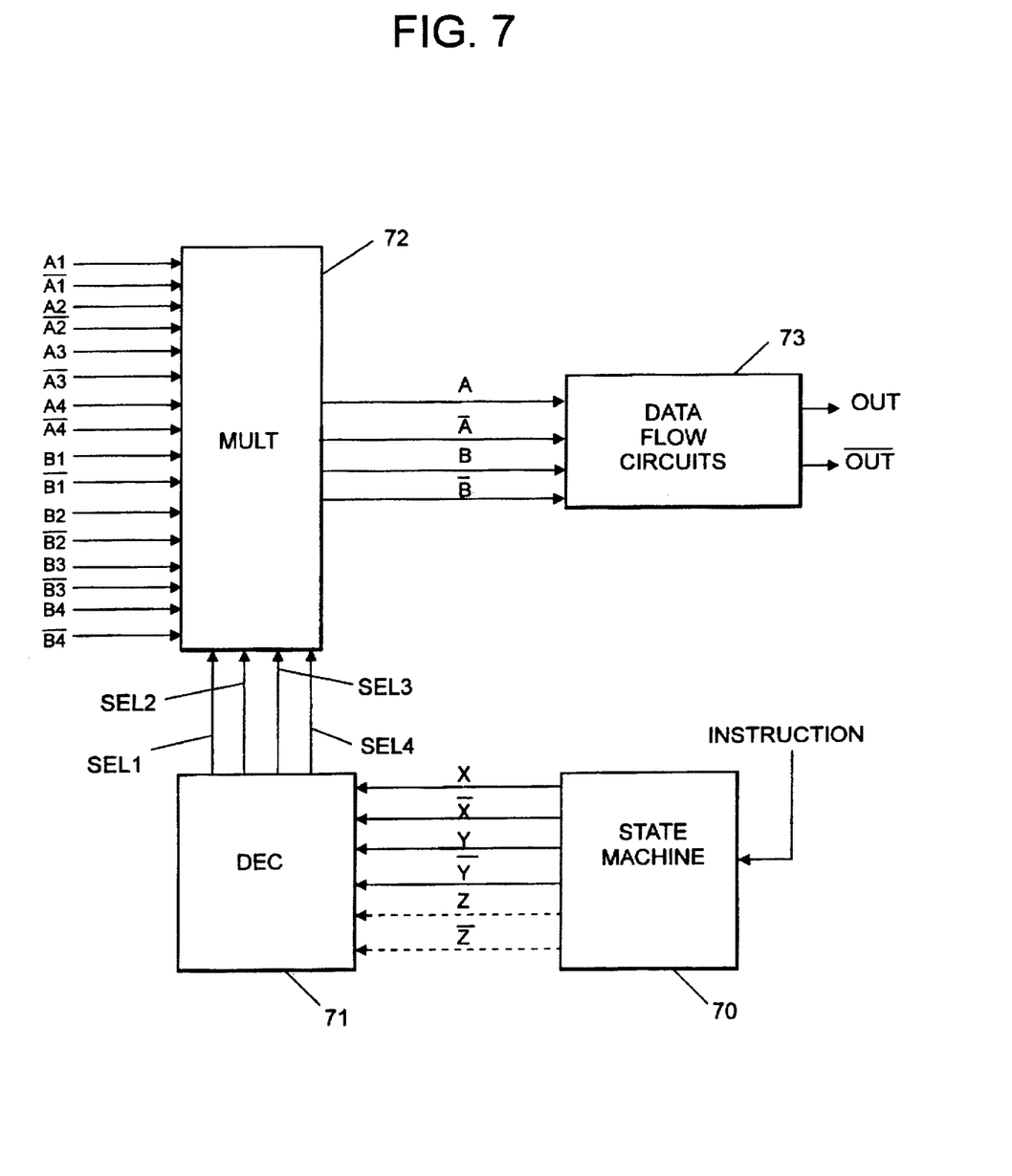
FIG. 7 illustrates a portion of a fixed point multiplier circuit configurable in accordance with the present invention.

Referring next to FIG. 7, an instruction from a dispatch circuit 62 in FIG. 6 is received by state machine 70 within multiplier 63. This instruction may include data and other coding operable for instructing multiplier 63 to perform a particular operation on selected data. The data may be transferred to multiplexor circuit 72 as indicated by the signals A1, A2, A3, etc. and their inverse signals. The data may be received from memory I/O 61. The instruction may also include one or more bits specifying the desired function to be performed on the inputted data. These bits will be used by state machine 70 to instruct decoder circuit 71 to send particular SELECT signals to multiplexor 72 for choosing which data input signals to send to data flow circuits 73. The signals from state machine 70 to decoder 71 are noted as X and Y signals and their inverse signals.

Figure 8:
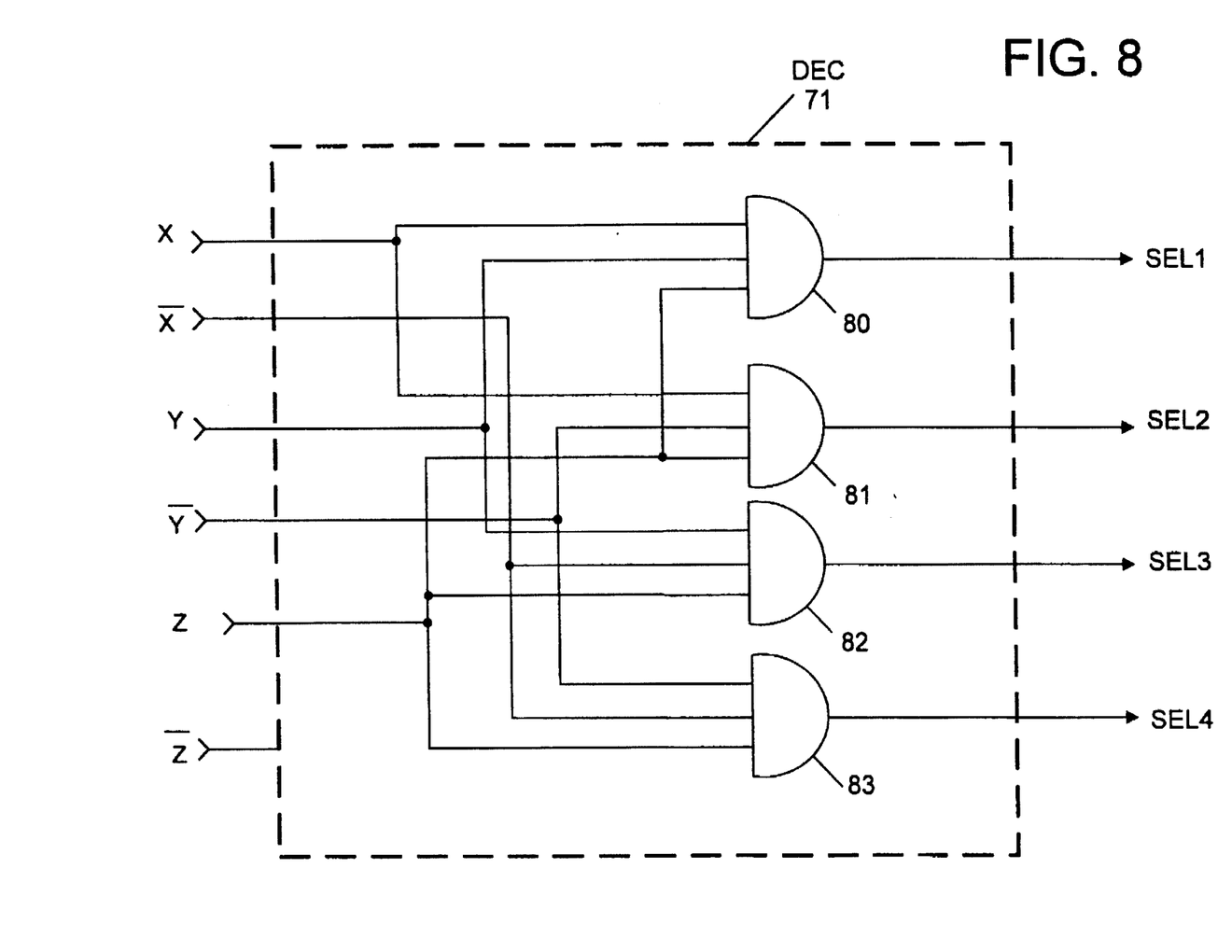
FIG. 8 illustrates the decoder circuit of FIG. 7.

Referring next to FIG. 8, there is illustrated a typical implementation of decoder circuit 71 wherein the aforementioned X and Y signals and their inverse signals are inputted into AND circuits 80-83 so as to produce the SELECT signals Sel1, Sel2, Sel3, Sel4. Thus, the instruction received by state machine 70 will be used by state machine 70 to signal multiplexor 72 through decoder 71 which of the inputted data signals to transfer to data flow circuits 73.

Figure 9:
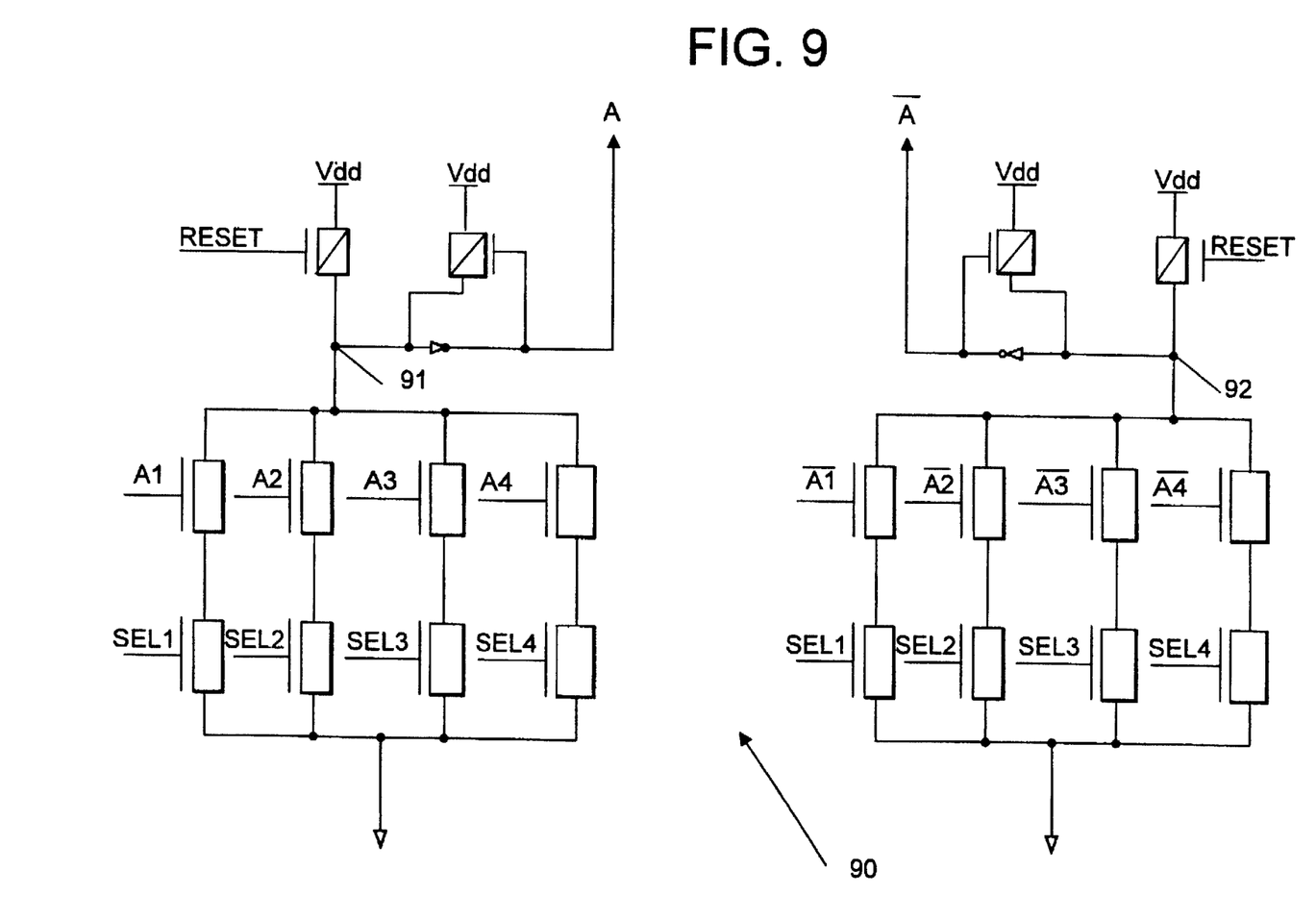
FIG. 9 illustrates a portion of the multiplexor circuit illustrated in FIG. 7.

Referring next to FIG. 9, there is illustrated a typical implementation of a portion 90 of multiplexor circuit 72, wherein the SELECT signals are coupled to N-type devices in series with N-type devices associated with several of the inputted data signals. For example, if the Sel1 signal is asserted, then data input signals a1 and the inverse of A1 will be transferred as signals A and the inverse of A to data flow circuits 73.

Circuit 90 is configured as a self-resetting circuit in much the same manner as described above with respect to FIGS. 2-4.

Figure 10:
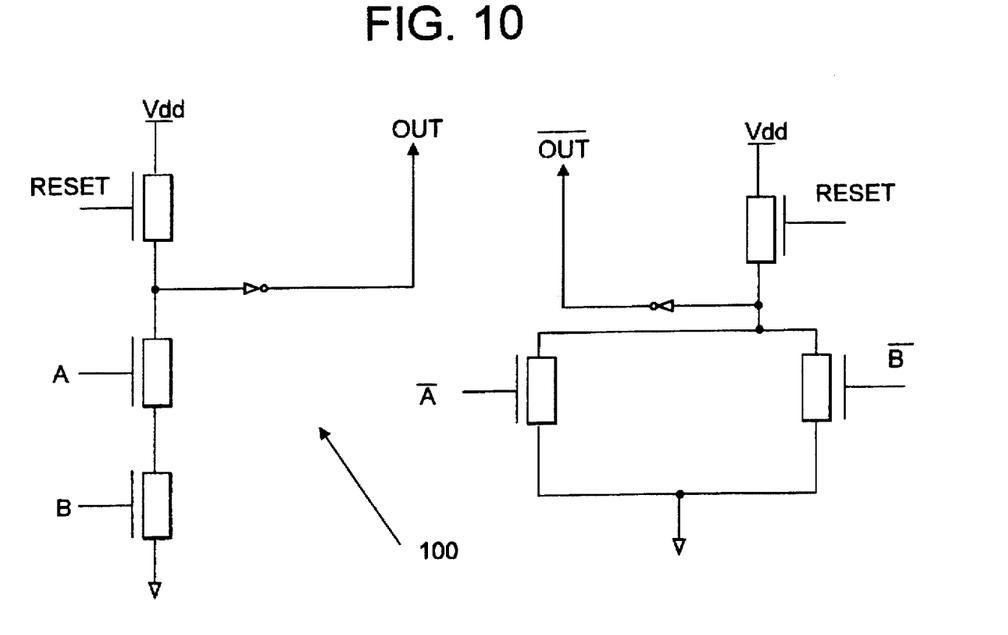
FIG. 10 illustrates an exemplary data flow circuit.

Referring next to FIG. 10, there is illustrated circuit 100, which may be one of data flow circuits 73, which in this example implements an AND logical operation on input signals A and B.

It can be readily seen by viewing circuit 90 in FIG. 9 that a dissipation of AC power will result during every machine cycle of processor 510, since each such circuit 90 within multiplexor circuit 72 will receive one or more of the SELECT signals regardless of whether or not it is desired that any of the signals inputted into circuit 90 are to be sent on to data flow circuits 73.

The idea of the present invention is to implement a "no select state" that inhibits specified self-resetting dynamic logic circuits from being evaluated so that the output node cannot be discharged to ground and no AC power is dissipated. In other words, if none of the SELECT signals sent to circuit 90 are asserted, then there is no way for the voltage signal residing at nodes 91 and 92 to be dissipated to ground since the N-type devices associated with the SELECT signals are turned off. The way this is done is to add signals Z (and maybe the inverse of Z) from state machine 70 to decoder circuit 71. As shown in FIG. 8, only the Z signal is required in this example, and it is inputted as a third input to each of AND circuits 80–83. If this Z signal is not asserted, then none of SELECT signals Sel1, Sel2, Sel3 or Sel4 will be asserted and therefore power dissipation will not occur within circuit 90.

State machine 70 provides this Z signal by observing the particular coding provided within the instruction so that state machine 70 does not assert the Z signal, in this example, when state machine 70 determines that there is no need to process any of the data inputted to multiplexor 72 on through to data flow circuit 73.

For example, an instruction may be received by the integer unit's instruction decoder, which turns on the proper bit fields to be correctly interpreted by the receiving execution units. Upon receiving the multiply instruction, the instruction decoder in multiplier 63 decodes it to one of four multiply instructions, namely a 64×64 multiply, a 32×32 multiply, a 16×16 multiply, or no multiply. Also, the no multiply instruction is a default state for all other non-multiply instructions to multiplier 63.

The first three multiply instructions out of the instruction decoder upon receipt by state machine 70 will generate the correct "X" and "Y" SELECT signals along with a "Z" signal that will be turned on. These three signals will then be received by decoder 71, which feeds SELECT signals to multiplexor 72 to in turn generate the corresponding correct SELECT signals to multiplexor 72 for the required multiply operation. For the no multiply case, the "Z" signal will be turned off by state machine 70, and hence the receiving decoder 71 will inhibit all SELECT signals to data flow mutliplexor 72.

In summary, when there is no need to provide any functionality of data flow circuits 73 (e.g., fixed point multiplier 63 is not required) and thus there is no instruction to perform such logical operations, state machine 70 will un-assert the Z signal so that none of the SELECT signals are asserted.

The concept of the present invention may be implemented with any size multiplexor circuit and can be further extended to other circuit types beyond fixed point multiplier 63.

Although the present invention and its advantages have been described in detail, it should be understood that various changes, substitutions and alterations can be made herein without departing from the spirit and scope of the invention as defined by the appended claims.

What is claimed is:

1. A self-resetting logic circuit comprising:
   means operable for receiving an input data signal;
   means operable for performing a logical operation on said input data signal to produce an output data signal;
   means operable for outputting said output data signal; and
   means, coupled to said performing means, operable for disabling said logic circuit.

2. The circuit as recited in claim 1, wherein said disabling means prevents said logic circuit from dissipating power.

3. The circuit as recited in claim 1, wherein said self-resetting logic circuit includes means for precharging a node in said circuit to a predetermined level in response to receipt of a feedback signal from said outputting means.

4. The circuit as recited in claim 3, wherein said performing means includes at least one N-FET device coupled between said node and a ground potential, and wherein said disabling means includes a FET device coupled in series with said N-FET device between said node and said ground potential.

5. The circuit as recited in claim 3, wherein said disabling means prevents said predetermined level from being discharged to ground.

6. The circuit as recited in claim 4, wherein said precharging means includes a P-FET device coupled between a voltage supply and said node.

7. The circuit as recited in claim 4, wherein said self-resetting logic circuit is implemented in a multiplexor circuit and said disabling means includes a means operable for receiving a SELECT signal from a decoder circuit coupled to said multiplexor circuit, wherein said self-resetting logic circuit is disabled when said SELECT signal causes said FET device to turn off.

8. The circuit as recited in claim 1, wherein said self-resetting logic circuit is implemented in a multiplexor circuit and said disabling means includes a means operable for receiving a SELECT signal from a decoder circuit coupled to said multiplexor circuit.

9. A multiplexor circuit comprising:
   a self-resetting logic circuit comprising a first means for receiving a first input data signal, a second means for receiving a second input data signal, a first selection means for selecting said first input data signal for output from said logic circuit, and a second selection means for selecting said second input dam signal for output from said logic circuit; and
   means for deselecting said first and second selection means so that neither of said first input data signal and said second input data signal is outputted from said logic circuit.

10. The multiplexor circuit as recited in claim 9, wherein said deselecting means further comprises:
    means for determining that said first input data signal and said second input data signal are not to be outputted from said logic circuit; and
    means for signalling said first and second selection means to turn off.

11. The multiplexor circuit as recited in claim 9, wherein said self-resetting logic circuit includes means for precharging a node in said circuit to a predetermined level in response to receipt of a feedback signal from an output of said logic circuit.

12. The circuit as recited in claim 11, wherein each of said first and second selection means includes at least one N-FET device coupled between said node and a ground potential, and wherein said deselecting means includes a FET device coupled in series with said N-FET device between said node and said ground potential.

13. The circuit as recited in claim 12, wherein said deselecting means prevents said predetermined level from being discharged to ground.

14. A data processing system comprising a processor, a storage device, a memory device, an input device, and an output device coupled via bus, said processor including a multiplier circuit comprising:
    means for receiving and decoding an instruction to perform a computation on inputted data;
    a data circuit for performing said computation;

a multiplexor circuit for selecting which of said inputted data to send to said data circuit, said multiplexor circuit operating in response to received selection signals;

a decoder circuit for sending said selection signals in response to receipt from said receiving and decoding means of data signals corresponding to said instruction;

means implemented in said decoder circuit for receiving an additional data signal from said receiving and decoding means instructing said decoder circuit to signal, through said selection signals, said multiplexor circuit to not send any of said inputted data to said data circuit.

15. The system as recited in claim 14, wherein said additional data signal from said receiving and decoding means is in response to a receipt of no instruction by said receiving and decoding means.

16. The system as recited in claim 14, wherein said receiving and decoding means is a state machine.

17. The system as recited in claim 14, wherein said decoder circuit comprises a plurality of logical AND circuits receiving said data signals and said additional data signal.

18. The system as recited in claim 14, wherein said multiplexor circuit further comprises:

a self-resetting logic circuit comprising a first means for receiving a first of said inputted dam, a second means for receiving a second of said inputted data, a first selection means for selecting said first of said inputted data for output from said logic circuit, and a second selection means for selecting said second of said inputted data for output from said logic circuit, wherein said instructing means deactivates said first and second selection means so that said first and second of said inputted data is not sent to said data circuit.

* * * * *

UNITED STATES PATENT AND TRADEMARK OFFICE
CERTIFICATE OF CORRECTION

PATENT NO. : 5,724,249
DATED : March 3, 1998
INVENTOR(S) : Kodali et al.

It is certified that error appears in the above-indentified patent and that said Letters Patent is hereby corrected as shown below:

Column 2, lines 56-57, replace "mining" with --turning--.

Column 6, line 33, replace "dam" with --data--.

Column 8, line 7, replace "dam" with --data--.

Signed and Sealed this

Twelfth Day of May, 1998

Attest:

BRUCE LEHMAN

Attesting Officer

Commissioner of Patents and Trademarks